United States Patent
Tseng (10) Patent No.: US 11,005,434 B2
(45) Date of Patent: May 11, 2021

(54) OUTPUT STAGE CIRCUIT, OPERATIONAL AMPLIFIER, AND SIGNAL AMPLIFYING METHOD CAPABLE OF SUPPRESSING VARIATION OF OUTPUT SIGNAL

(71) Applicant: NOVATEK MICROELECTRONICS CORP., HsinChu (TW)

(72) Inventor: De-Shiou Tseng, Taichung (TW)

(73) Assignee: NOVATEK MICROELECTRONICS CORP., Hsinchu (TW)

( * ) Notice: Subject to any disclaimer, the term of this patent is extended or adjusted under 35 U.S.C. 154(b) by 112 days.

(21) Appl. No.: 16/421,538

(22) Filed: May 24, 2019

(65) Prior Publication Data

US 2020/0373893 A1 Nov. 26, 2020

(51) Int. Cl.
  *H03F 3/45* (2006.01)
  *H03G 1/00* (2006.01)
  *H03G 3/30* (2006.01)
  *H03F 3/30* (2006.01)

(52) U.S. Cl.
  CPC ....... *H03F 3/45094* (2013.01); *H03G 1/0023* (2013.01); *H03G 3/30* (2013.01); *H03F 3/3022* (2013.01); *H03F 3/45183* (2013.01)

(58) Field of Classification Search
  CPC .............. H03F 3/45094; H03F 3/3022; H03F 3/45183; H03F 3/45192; H03F 3/45179; H03G 1/0023; H03G 3/30
  USPC .................................................. 330/253, 255
  See application file for complete search history.

(56) References Cited

U.S. PATENT DOCUMENTS

| | | | | |
|---|---|---|---|---|
| 6,066,985 A * | 5/2000 | Xu | ........................ | H03F 3/3028 330/253 |
| 6,208,208 B1* | 3/2001 | Komatsu | ............... | H03F 3/3028 330/255 |
| 6,552,613 B2* | 4/2003 | Murray | ................. | H03F 3/3066 330/255 |

(Continued)

FOREIGN PATENT DOCUMENTS

TW 201434265 A 9/2014

OTHER PUBLICATIONS

TW Office Action dated Jul. 24, 2020 in Taiwan application (No. 108125328).

*Primary Examiner* — Khanh V Nguyen
(74) *Attorney, Agent, or Firm* — McClure, Qualey & Rodack, LLP (57) ABSTRACT

An output stage circuit of an operational amplifier, the operational amplifier, and a signal amplifying method applied to the operational amplifier are provided. The output stage circuit includes an inverting circuit and a compensation module. The inverting circuit is electrically connected to a gain stage circuit of the operational amplifier. The inverting circuit generates an output signal of the operational amplifier. The compensation module includes a first compensation circuit, including a first current providing path and a first suppression activation circuit. The first current providing path provides a first compensation current. The first suppression activation circuit conducts the first compensation current to the inverting circuit if a first compensation condition related to a first gain stage signal generated by the gain stage circuit is satisfied. Variation of the output signal is suppressed because of the first compensation current.

20 Claims, 9 Drawing Sheets

(56) References Cited

U.S. PATENT DOCUMENTS

| | | | | |
|---|---|---|---|---|
| 6,828,855 B1* | 12/2004 | Wang | ............ | H03F 1/308 |
| | | | | 330/253 |
| 7,342,450 B2* | 3/2008 | Jones | ............ | H03F 3/3022 |
| | | | | 327/561 |
| 7,557,658 B2* | 7/2009 | Perez | ............ | H03F 1/02 |
| | | | | 330/255 |
| 7,570,113 B2* | 8/2009 | Welty | ............ | H03F 1/52 |
| | | | | 330/253 |
| 7,834,689 B1* | 11/2010 | Pietri | ............ | H03F 3/45183 |
| | | | | 330/253 |
| 8,044,950 B2* | 10/2011 | Satou | ............ | G09G 3/3688 |
| | | | | 345/211 |
| 8,451,060 B2* | 5/2013 | Chen | ............ | H03F 3/3022 |
| | | | | 330/292 |
| 8,653,893 B2* | 2/2014 | Tsuchi | ............ | G09G 3/3688 |
| | | | | 330/255 |
| 9,106,189 B2 | 8/2015 | Lin et al. | | |
| 9,892,703 B2 | 2/2018 | Tsuchi | | |

* cited by examiner

OUTPUT STAGE CIRCUIT, OPERATIONAL AMPLIFIER, AND SIGNAL AMPLIFYING METHOD CAPABLE OF SUPPRESSING VARIATION OF OUTPUT SIGNAL

TECHNICAL FIELD

The disclosure relates in general to an output stage circuit, an operational amplifier, and a signal amplifying method, and more particularly to an output stage circuit, an operational amplifier, and a signal amplifying method capable of suppressing the variation of the output signal of the operational amplifier.

BACKGROUND

An operational amplifier (OpAmp) is widely applied to different modern electronic devices. For example, the operational amplifier may be used in a driver circuit for driving a display panel, such as a liquid crystal display (LCD) panel.

Figure 1:
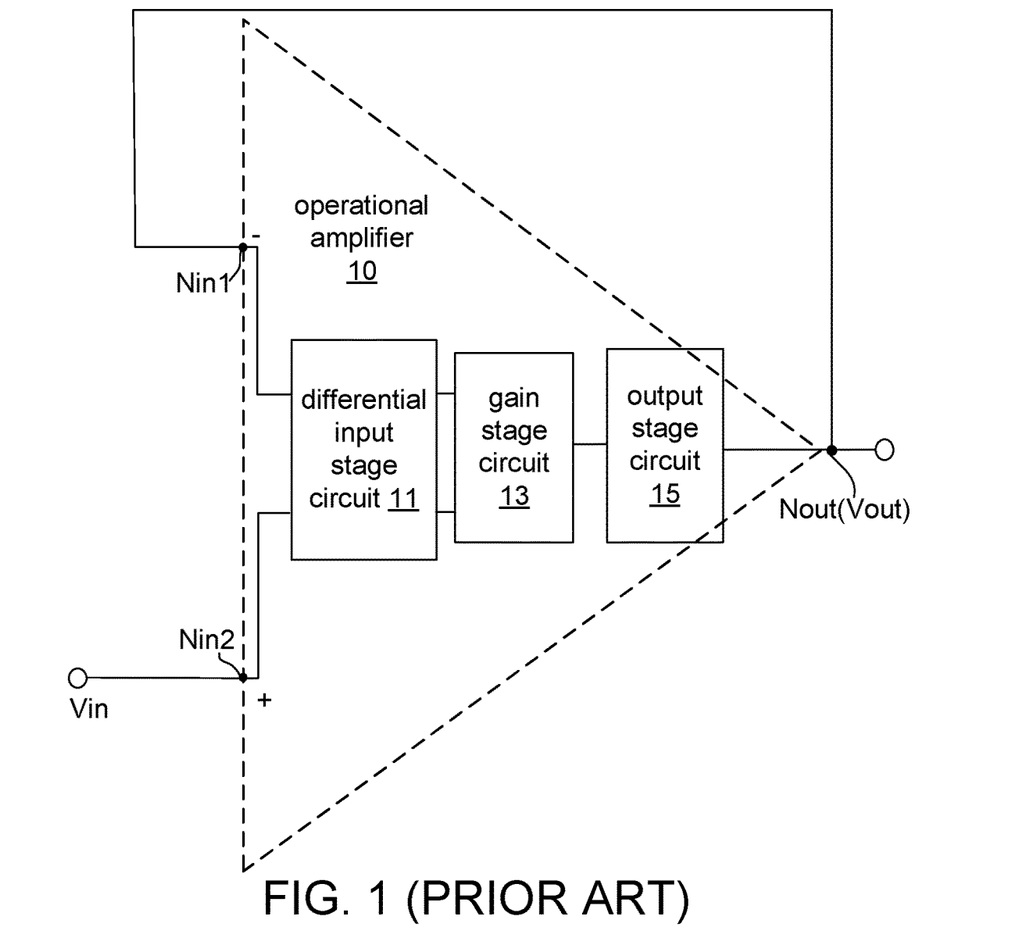
FIG. 1 (prior art) is a schematic diagram illustrating an internal circuit configuration of an operational amplifier.

FIG. 1 (prior art) is a schematic diagram illustrating an internal circuit configuration of an operational amplifier. The operational amplifier 10 includes an inverting input terminal Nin1, a non-inverting input terminal Nin2, an output terminal Nout, a differential input stage circuit 11, a gain stage circuit 13, and an output stage circuit 15. The gain stage circuit 13 is electrically connected to the differential input stage circuit 11 and the output stage circuit 15.

As shown in FIG. 1, the operational amplifier 10 has its inverting input terminal Nin1 connected with the output terminal Nout. Such a device is called a "voltage follower" (VF) because the output signal Vout follows the input signal Vin (Vin=Vout). A voltage follower is also known as a unity gain buffer because it has a gain of "1".

The differential input stage circuit 11 amplifies a voltage difference between the input signal Vin and the output signal Vout to generate an input stage signal. Then, the gain stage circuit 13 provides a voltage gain to the input stage signal and generates a gain stage signal Vgu/Vgd accordingly. The gain stage signal Vgu/Vgd is further converted by output stage circuit 15 to generate the output signal Vout.

In practical design, the input signal Vin may transit instantaneously so that the transitory values of the output signal Vout may exceed the final value of the output signal Vout. The phenomenon that the transitory values of the output signal Vout exceed the final value of the output signal Vout is called "overshoot." In contrast, when the transitory values of the output signal Vout are lower than the final value of the output signal Vout, such a phenomenon is called "undershoot."

Figure 2A:
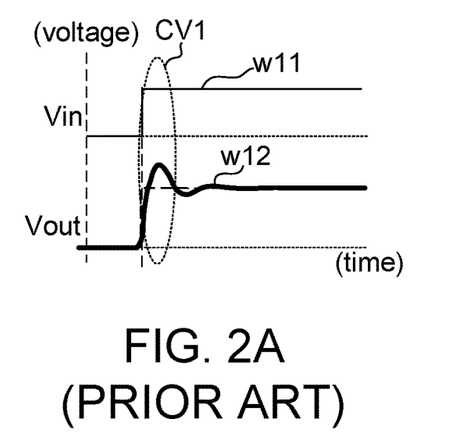
FIG. 2A (prior art) is a waveform diagram illustrating that an overshoot exists in the output signal of the operational amplifier.

FIG. 2A (prior art) is a waveform diagram illustrating that an overshoot exists in the output signal of the operational amplifier. The waveform w11 represents that the input signal Vin significantly changes from a relatively low voltage to a relatively high voltage. The waveform w12 represents that the output signal Vout increases instantaneously in response to the significant increment of the input signal Vin. As indicated by the dotted ellipse CV1, an overshoot occurs at the transient response of the output signal Vout.

Figure 2B:
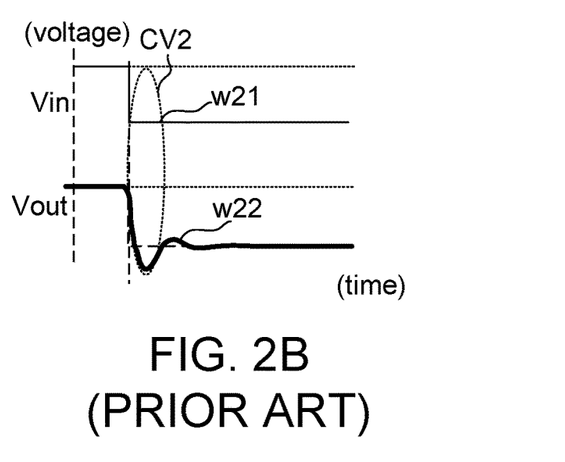
FIG. 2B (prior art) is a waveform diagram illustrating that an undershoot exists in the output signal of the operational amplifier.

FIG. 2B (prior art) is a waveform diagram illustrating that an undershoot exists in the output signal of the operational amplifier. The waveform w21 represents that the input signal Vin significantly changes from a relatively high voltage to a relatively low voltage. The waveform w22 represents that the output signal Vout decreases instantaneously in response to the significant decrement of the input signal Vin. As indicated by the dotted ellipse CV2, an undershoot occurs at the transient response of the output signal Vout.

The overshoot and undershoot represent that the output signal Vout of the unity gain buffer cannot follow changes of the input signal Vin immediately. Therefore, it is desired to reduce the effects of overshoot and undershoot.

SUMMARY

The disclosure is directed to an output stage circuit, an operational amplifier, and a signal amplifying method capable of suppressing the variation of the output signal of the operational amplifier.

According to one embodiment, an output stage circuit of an operational amplifier is provided. The output stage circuit includes an inverting circuit, an inverting circuit, and a compensation module. The inverting circuit is electrically connected to a gain stage circuit of the operational amplifier. The inverting circuit is configured to generate an output signal of the operational amplifier. The compensation module is electrically connected to the inverting circuit and the gain stage circuit. The compensation circuit includes a first compensation circuit, and the first compensation circuit includes a first current providing path and a first suppression activation circuit. The first current providing path is configured to provide a first compensation current. The first suppression activation circuit is electrically connected to the first current providing path and the inverting circuit. The first suppression activation circuit is configured to conduct the first compensation current to the inverting circuit if a first compensation condition related to a first gain stage signal generated by the gain stage circuit is satisfied. Moreover, the variation of the output signal is suppressed because of the first compensation current.

According to another embodiment, an operational amplifier is provided. The operational amplifier includes a differential input stage circuit, a gain stage circuit, and an output stage circuit. The differential input stage circuit is configured to amplify a voltage difference between an input signal and an output signal of the operational amplifier to generate an input stage signal. The gain stage circuit is electrically connected to the differential input stage circuit. The gain stage circuit is configured to provide a voltage gain to the input stage signal and accordingly generate a first gain stage signal. The output stage circuit includes an inverting circuit and a compensation module. The inverting circuit is electrically connected to the gain stage circuit. The inverting circuit is configured to generate the output signal. The compensation module is electrically connected to the inverting circuit. The compensation module includes a first compensation circuit, which includes a first current providing path and a first suppression activation circuit. The current providing path is configured to provide a first compensation current. The first suppression activation circuit is electrically connected to the first current providing path and the inverting circuit. The first suppression activation circuit is configured to conduct the first compensation current to the inverting circuit if a first compensation condition related to the first gain stage signal is satisfied. Moreover, the variation of the output signal is suppressed because of the first compensation current.

According to an alternative embodiment, a signal amplifying method applied to an operational amplifier is provided. The method includes the following steps. Firstly, a voltage difference between an input signal and an output signal of the operational amplifier is amplified to generate an input stage signal. Then, a voltage gain to the input stage signal is provided, and a first gain stage signal is accordingly generated. Later, an output signal is generated, and a first compensation current is conducted to adjust the first gain stage signal if a first compensation condition related to the first gain stage signal is satisfied. Furthermore, the variation of the output signal is suppressed because of the first compensation current.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

As illustrated above, the overshoot and undershoot of the unity gain buffer need to be reduced. According to an embodiment of the present disclosure, a compensation module is adopted in the output stage circuit of the operational amplifier. With the compensation module, the operational amplifier can suppress the overshoot and/or undershoot in a real-time manner.

Figure 3:
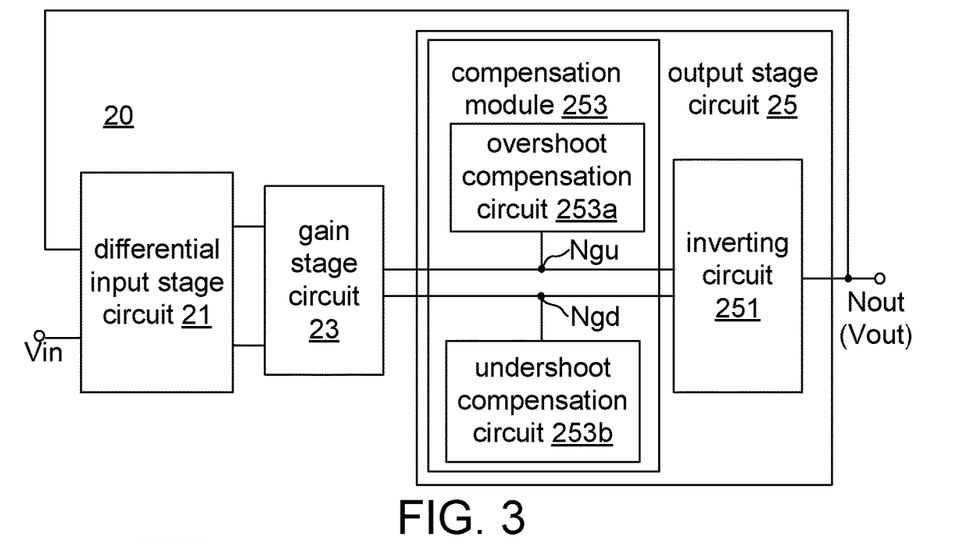
FIG. 3 is a schematic diagram illustrating that a compensation module capable of suppressing the overshoot and/or the undershoot is adopted in an operational amplifier.

FIG. 3 is a schematic diagram illustrating that a compensation module capable of suppressing the overshoot and/or the undershoot is adopted in an operational amplifier. In the specification, the output stage circuit 25 includes an inverting circuit 251 and a compensation module 253. The inverting circuit 251 is electrically connected to the gain stage circuit 23 and the differential input stage circuit 21. The compensation module 253 further includes an overshoot compensation circuit 253a and/or an undershoot compensation circuit 253b; both are electrically connected in between the gain stage circuit 23 and the inverting circuit 251.

When the input signal Vin remains stable, the output signal Vout remains stable as well. Under such circumstance, none of the overshoot compensation circuit 253a and the undershoot compensation circuit 253b needs to be enabled. Alternatively speaking, during the stable state of the operational amplifier 20, none of the overshoot compensation circuit 253a and the undershoot compensation circuit 253b functions.

Figure 4:
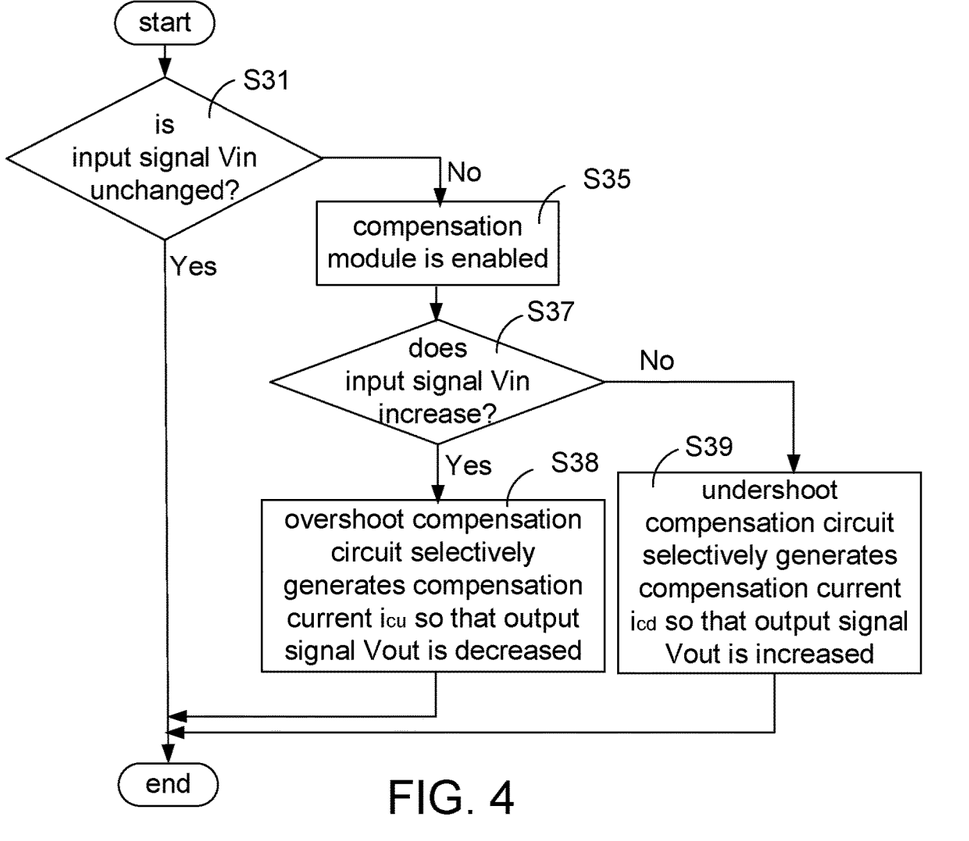
FIG. 4 is a flow diagram illustrating operations of the compensation module.

FIG. 4 is a flow diagram illustrating operations of the compensation module. Firstly, it is determined whether the input signal Vin remains unchanged (step S31). If the determination result of step S31 is positive, the flow ends. Otherwise, the compensation module 253 is enabled (step S35), and it operates in response to increment or decrement of the input signal Vin (step S37).

In a case that the input signal Vin increases, the overshoot compensation circuit 253a is enabled and the undershoot compensation circuit 253b is disabled. The overshoot compensation circuit 253a selectively generates a compensation current $i_{cu}$ in order to decrease the output signal Vout (step S38). More details about the operations related to the overshoot compensation circuit 253a, including an overshoot compensation condition, when the compensation current $i_{cu}$ is generated and how a generation of the compensation current $i_{cu}$ changes the output signal Vout, etc., are illustrated in FIGS. 5A, 5B, and 6.

In another case that the input signal Vin decreases, the overshoot compensation circuit 253a is disabled and the undershoot compensation circuit 253b is enabled. The undershoot compensation circuit 253b selectively generates another compensation current $i_{cd}$ in order to increase the output signal Vout (step S39). More details about the operations related to the undershoot compensation circuit 253b, including the undershoot compensation condition, when the compensation current $i_{cd}$ is generated, and how a generation of the compensation current $i_{cd}$ changes the output signal Vout, etc., are illustrated in FIGS. 7A, 7B, and 8.

In short, the overshoot compensation circuit 253a is utilized for suppressing the overshoot, and the undershoot compensation circuit 253b is utilized for suppressing the undershoot, respectively. Therefore, operations of the overshoot compensation circuit 253a and the undershoot compensation circuit 253b are independent. In practical application, it is possible that the operational amplifier is equipped with only one of the overshoot compensation circuit 253a and the undershoot compensation circuit 253b, depending on the potential variation of the output signal Vout.

Figure 5A:
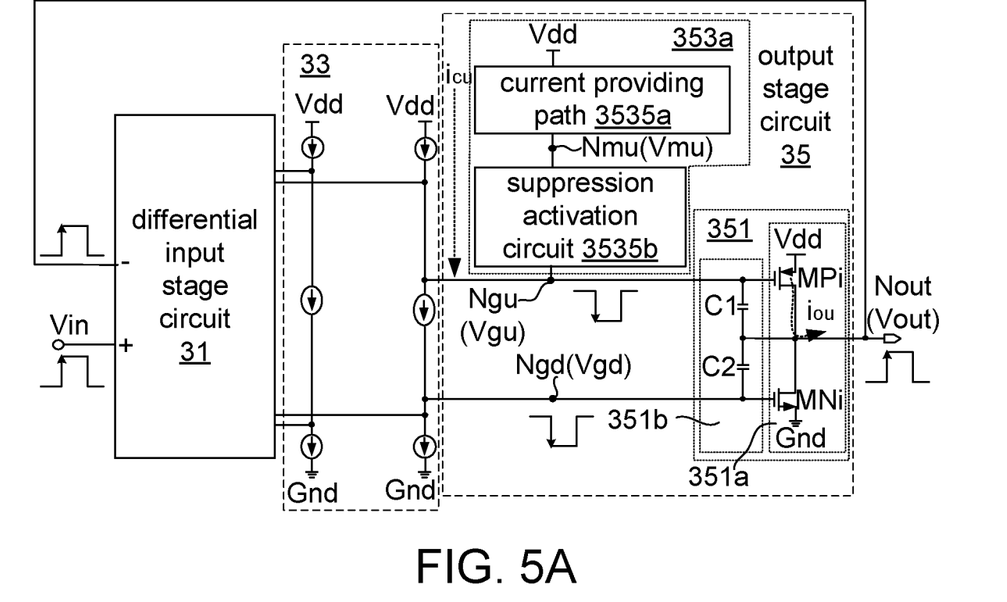
FIG. 5A is a schematic diagram illustrating an embodiment of the overshoot compensation circuit.
Figure 5B:
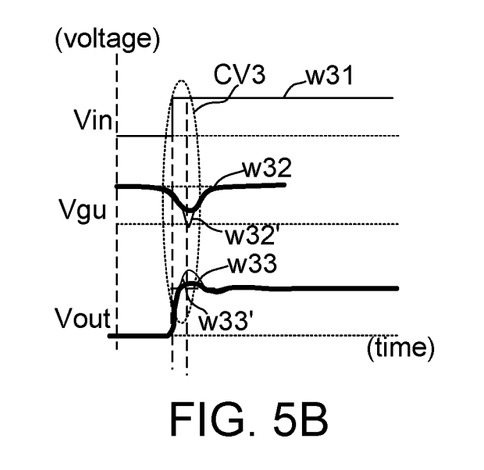
FIG. 5B is a schematic diagram illustrating how the compensation circuit in FIG. 5A indirectly influences the output signal with a compensation current when the input signal Vin significantly changes from a relatively low voltage to a relatively high voltage.
Figure 6:
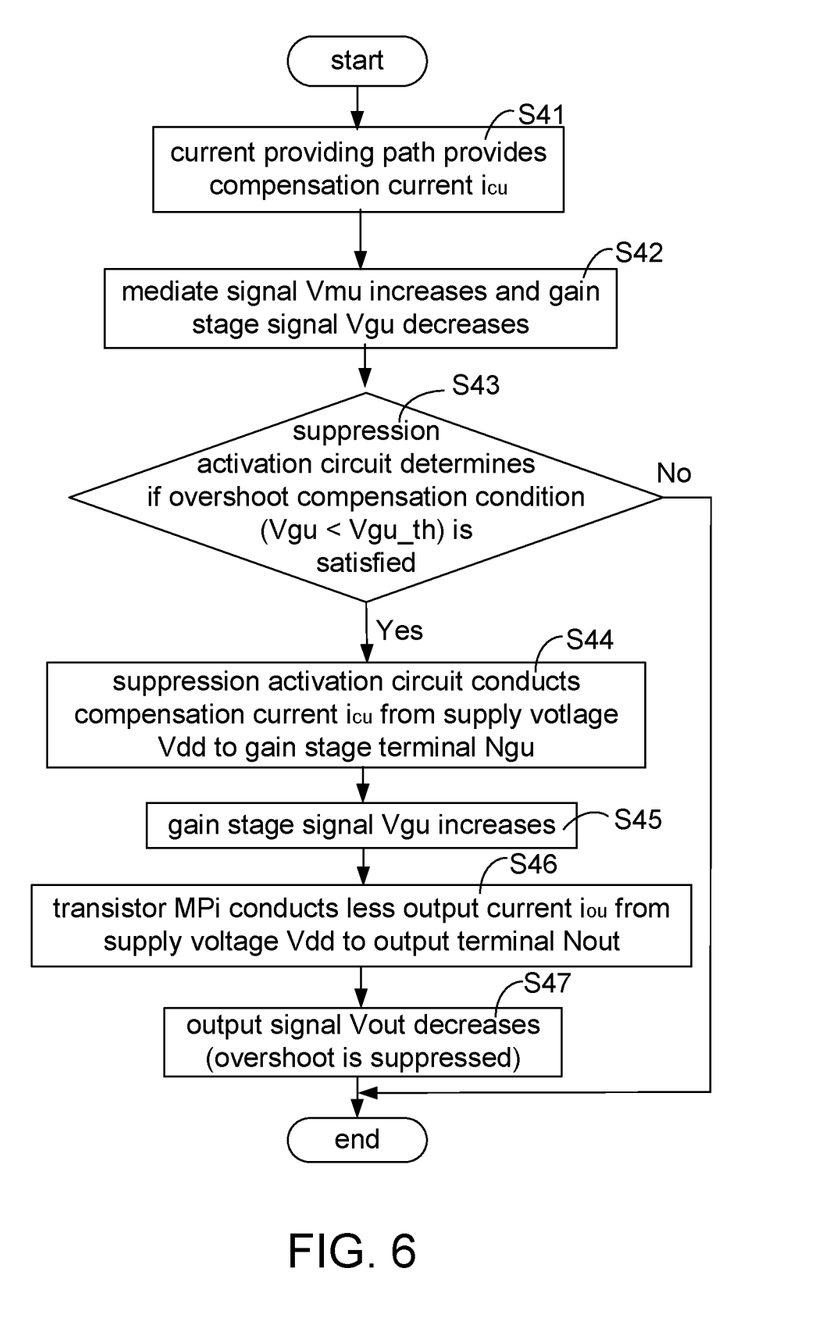
FIG. 6 is a flow diagram illustrating operations of the compensation circuit in FIG. 5A.
Figure 7A:
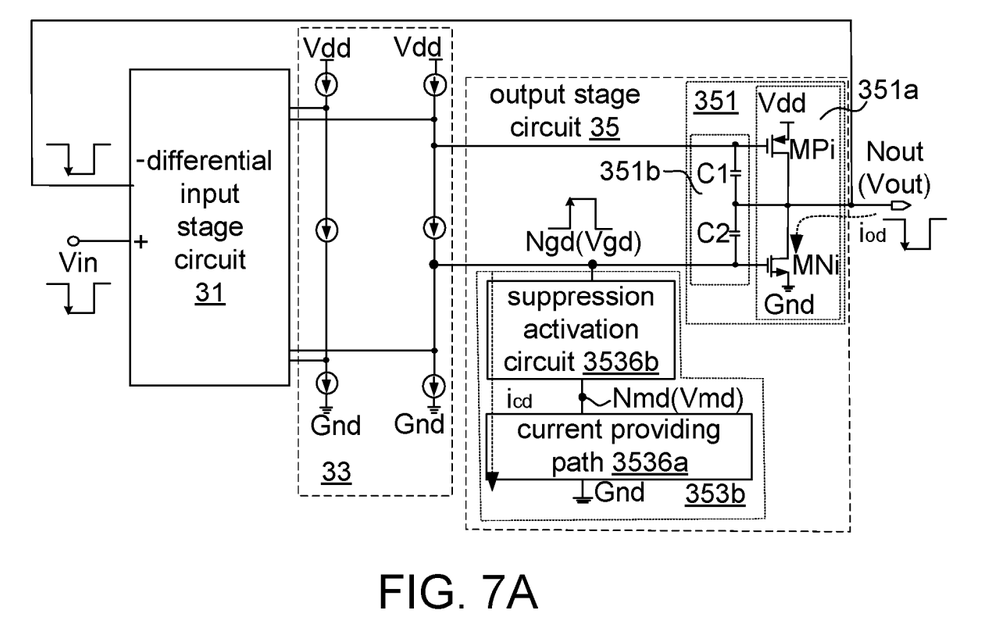
FIG. 7A is a schematic diagram illustrating an embodiment of the undershoot compensation circuit.
Figure 7B:
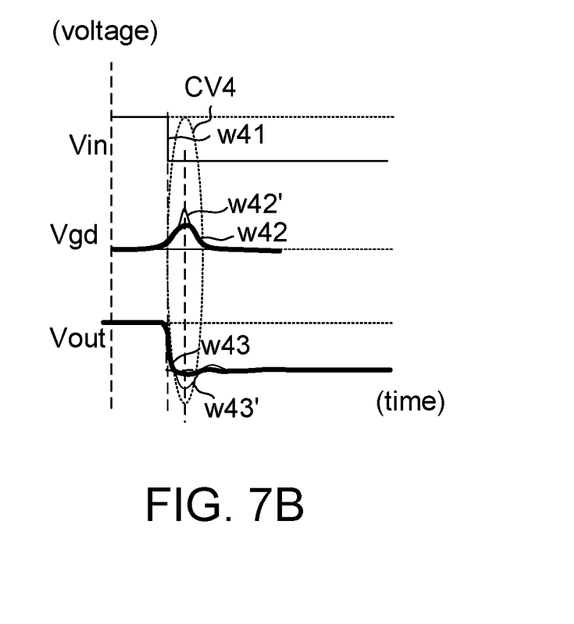
FIG. 7B is a schematic diagram illustrating how the compensation circuit in FIG. 7A indirectly influences the output signal with a compensation current when the input signal Vin significantly changes from a relatively high voltage to a relatively low voltage.
Figure 8:
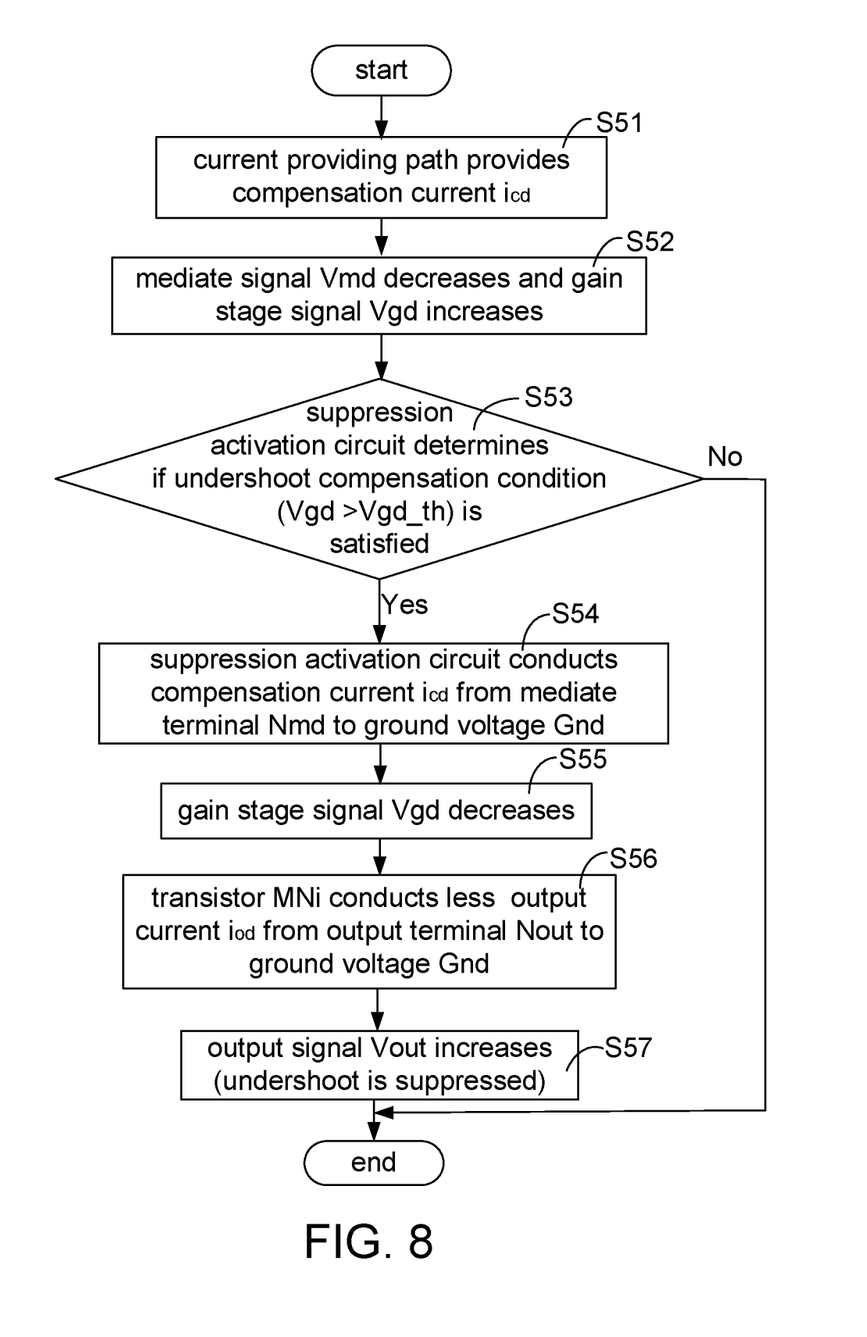
FIG. 8 is a flow diagram illustrating operations of the compensation circuit in FIG. 7A.

Please refer to FIGS. 5A and 7A together. After receiving the input signal Vin, the differential input stage circuit 31 generates an input stage signal to the gain stage circuit 33. Later, the gain stage circuit 33 provides a voltage gain to the input stage signal and generates a gain stage signal Vgu (FIG. 5A)Ngd(FIG. 7A) to the output stage circuit 35 accordingly. The operational amplifier in FIG. 5A is an embodiment that the compensation module includes only the overshoot compensation circuit 353a. The operational amplifier shown in FIG. 7A is an embodiment that the compensation module includes only the undershoot compensation circuit 353b.

The inverting circuits 351 shown in FIGS. 5A and 7A have similar components, for example, an inverter including transistors Pi, Ni, and stabilization capacitors C1, C2. The transistors Pi, Ni, and the stabilization capacitors C1, C2 are arranged in a symmetric manner.

The gate terminal of the transistor MPi is electrically connected to the overshoot compensation circuit and the gain stage circuit 33 through a gain stage terminal Ngu. The signal at the gain stage terminal Ngu (gain stage signal Vgu) determines whether the transistor MPi is turned on or not. In FIGS. 5A, 5B and 6, scenarios about how the switching status of the transistor MPi is determined, and its consequences are illustrated.

On the other hand, the gate terminal of the transistor MNi is electrically connected to the undershoot compensation circuit and the gain stage circuit 33 through a gain stage terminal Ngd. The signal at the gain stage terminal Ngd (gain stage signal Vgd) determines whether the transistor MNi is turned on or not. In FIGS. 7A, 7B and 8, scenarios about how the switching status of the transistor MNi is determined and its consequences are illustrated.

The gain stage signals Vgu, Vgd are generated by the gain stage circuit 33. Basically, the relationships between the input signal Vin and the gain stage signals Vgu, Vgd can be summarized as below. When the input signal Vin increases, the gain stage signals Vgu, Vgd decrease. Alternatively, when the input signal Vin decreases, the gain stage signals Vgu, Vgd increase. In the present disclosure, in addition to the gain stage circuit 33, the gain stage signals Vgu, Vgd are also affected by the compensation module. In short, the gain stage signal Vgu is related to the operation of the overshoot compensation circuit 353a, and the gain stage signal Vgd is related to the operation of the undershoot compensation circuit 353b.

As illustrated above, the gain stage signal Vgu decreases when the input signal Vin increases. According to the embodiment of the present disclosure, for the same increment degree of the input signal Vin, the gain stage signal Vgu at the output stage circuit having the overshoot compensation circuit 353a decreases less than that at the output stage circuit without the overshoot compensation circuit 353a. Alternatively speaking, the overshoot compensation circuit 353a is designed to moderate the effects caused by increment of the input signal Vin. The design concept of the overshoot compensation circuit 353a is illustrated in FIGS. 5A, 5B and 6.

FIG. 5A is a schematic diagram illustrating an embodiment of the overshoot compensation circuit. The overshoot compensation circuit 353a includes a current providing path 3535a and a suppression activation circuit 3535b. A terminal between the current providing path 3535a and the suppression activation circuit 3535b is defined as a mediate terminal Nmu, and the signal of the mediate terminal Nmu is defined as a mediate signal Vmu. The current providing path 3535a is electrically connected to a voltage source providing a supply voltage Vdd. The suppression activation circuit 3535b is electrically connected to the current providing path 3535a and the gain stage terminal Ngu.

The current providing path 3535a consistently provides a compensation current $i_{cu}$, and the suppression activation circuit 3535b selectively conducts the compensation current $i_{cu}$ from the supply voltage Vdd to the gain stage terminal Ngu. In the specification, an overshoot compensation condition is defined. When the overshoot compensation condition is satisfied, the suppression activation circuit 3535b conducts the compensation current $i_{cu}$ to the gain stage terminal Ngu so that the gain stage signal Vgu is increased, and increment of the gain stage signal Vgu further causes a decrement of the output signal Vout. An exemplary overshoot compensation circuit will be explained in FIG. 9.

The gain stage signal Vgu is slightly increased when the compensation current $i_{cu}$ flows to the gain stage terminal Ngu. The slight increment of the gain stage signal Vgu implies that the voltage difference between the source terminal and the gate terminal of the transistor MPi slightly decreases and the conduction of the transistor MPi is slightly affected. Consequentially, the output current $i_{ou}$ flowing from the supply voltage Vdd to the output terminal Nout is slightly decreased due to the decrement of the gain stage signal Vgu. Once the output current $i_{ou}$ decreases, the output signal Vout decreases and the overshoot is suppressed accordingly. Therefore, the overshoot can be indirectly suppressed owing to the conduction of the compensation current $i_{cu}$.

FIG. 5B is a schematic diagram illustrating how the compensation circuit in FIG. 5A indirectly influences the output signal with a compensation current when the input signal Vin significantly changes from a relatively low voltage to a relatively high voltage. The waveform w31 represents the input signal Vin. The waveforms w32', w33' respectively represent the gain stage signal Vgu and the output signal Vout when the overshoot compensation circuit 353a is not in use. The waveforms w32, w33 respectively represent the gain stage signal Vgu and the output signal Vout when the overshoot compensation circuit 353a is in use.

The dotted ellipse CV3 indicates the timing when the input signal Vin significantly changes from a relatively low voltage to a relatively high voltage, and the waveforms w32, w32', w33, w33' within the dotted ellipse CV3 are concerned. Within the area of the dotted ellipse CV3, the waveforms w32, w32' show that the gain stage signal Vgu drops for a certain degree and the waveforms w33, w33' show that the output signal Vout dramatically increases as soon as the input signal Vin increases significantly.

Comparing with the waveform w32', the waveform w32 shows that the minimum value of the gain stage signal Vgu becomes higher when the overshoot compensation circuit 353a is in use. That is, the gain stage signal Vgu increases when the overshoot compensation circuit 353a provides the compensation current $i_{cu}$ to the gain stage terminal Ngu. Meanwhile, the waveform w33 shows that the maximum value of the output signal Vout becomes relatively flat when the overshoot compensation circuit 353a is in use. That is, with the generation of the compensation current $i_{cu}$, the output signal Vout is decreased, and the overshoot is suppressed.

FIG. 6 is a flow diagram illustrating operations of the compensation circuit in FIG. 5A. Firstly, the current providing path 3535a provides the compensation current $i_{cu}$ (step S41), and the mediate signal Vmu increases accordingly (step S42). Meanwhile, the gain stage signal Vgu decreases in response to the rising of the input signal Vin. Then, the suppression activation circuit 3535b compares the gain stage signal Vgu with an overshoot threshold Vgu_th and determines if the overshoot compensation condition, for example, Vgu<Vgu_th, is satisfied (step S43). If the determination result of step S43 is negative, the flow ends, and the overshoot compensation circuit 3535b does not affect the gain stage signal Vgu nor the output signal Vout.

If the determination result of step S43 is positive, the overshoot compensation circuit 3535b operates and passes the compensation current $i_{cu}$ to the gain stage terminal Ngu (step S44). Accordingly, the gain stage signal Vgu increases as the compensation current $i_{cu}$ transmits the supply voltage Vdd to the gain stage terminal Ngu (step S45). With the increment of the gain stage signal Vgu, the transistor MPi conducts less output current $i_{ou}$ from the supply voltage Vdd to the output terminal Nout (step S46). Later, the output signal Vout decreases and the overshoot is suppressed accordingly (step S47).

As illustrated above, the gain stage signal Vgd increases when the input signal Vin decreases. According to the embodiment of the present disclosure, for the same decrement degree of the input signal Vin, the gain stage signal Vgd at the output stage circuit having the undershoot compensation circuit 353b increases less than that at the output stage circuit without the undershoot compensation circuit 353b. Alternatively speaking, the undershoot compensation circuit 353b is designed to moderate the effects caused by the decrement of the input signal Vin. The design concept of the undershoot compensation circuit 353b is illustrated in FIGS. 7A, 7B and 8.

FIG. 7A is a schematic diagram illustrating an embodiment of the undershoot compensation circuit. The undershoot compensation circuit 353b includes a current providing path 3536a, and a suppression activation circuit 3536b. A terminal between the current providing path 3536a and the suppression activation circuit 3536b is defined as a mediate terminal Nmd, and the signal of the mediate terminal Nmd is defined as a mediate signal Vmd. The current providing path 3536a is electrically connected to another voltage source (ground terminal Gnd) providing a ground voltage Gnd. The suppression activation circuit 3536b is electrically connected to the current providing path 3536a and the gain stage terminal Ngd.

The current providing path 3536a consistently provides a compensation current $i_{cd}$, and the suppression activation circuit 3536b selectively conducts the compensation current $i_{cd}$ from the gain stage terminal Ngu to the ground voltage Gnd. In the specification, an undershoot compensation condition is defined. When the undershoot compensation condition is satisfied, the suppression activation circuit 3536b conducts the compensation current $i_{cd}$ to the gain stage terminal Ngd so that the gain stage signal Vgd is decreased, and decrement of the gain stage signal Vgd further causes an increment of the output signal Vout. An exemplary undershoot compensation circuit will be explained in FIG. 9.

The gain stage signal Vgd is slightly decreased when the compensation current $i_{cd}$ flows to the gain stage terminal Ngu. The slight decrement of the gain stage signal Vgd implies that the voltage difference between the gate terminal and the source terminal of the transistor MPi slightly decreases and the conduction of the transistor MNi is slightly affected. Consequentially, the output current $i_{od}$ flowing from the output terminal Nout to the ground voltage Gnd is slightly decreased due to the increment of the gain stage signal Vgd. Once the output current $i_{od}$ decreases, the output signal Vout increases and the undershoot is suppressed accordingly. Therefore, the undershoot can be indirectly suppressed owing to the conduction of the compensation current $i_{cd}$.

FIG. 7B is a schematic diagram illustrating how the compensation circuit in FIG. 7A indirectly influences the output signal with a compensation current when the input signal Vin significantly changes from a relatively high voltage to a relatively low voltage. The waveform w41 represents the input signal Vin. The waveforms w42', w43' respectively represent the gain stage signal Vgd and the output signal Vout when the undershoot compensation circuit 353b is not in use. The waveforms w42, w43 respectively represent the gain stage signal Vgd and the output signal Vout when the undershoot compensation circuit 353b is in use.

The dotted ellipse CV4 indicates the timing when the input signal Vin significantly changes from a relatively high voltage to a relatively low voltage, and the waveforms w42, w42', w43, w43' within the dotted ellipse CV4 are concerned. Within the area of the dotted ellipse CV4, the waveforms w42, w42' show that the gain stage signal Vgd increases for a certain degree and the waveforms w43, w43' show that the output signal Vout dramatically decreases as soon as the input signal Vin decreases significantly.

Comparing with the waveform w42', the waveform w42 shows that the maximum value of the gain stage signal Vgd becomes lower when the undershoot compensation circuit 353b is in use. That is, the gain stage signal Vgd decreases when the undershoot compensation circuit 353b provides the compensation current $i_{cd}$ to the gain stage terminal Ngd. Meanwhile, the waveform w43 shows that the minimum value of the output signal Vout becomes relatively flat when the undershoot compensation circuit 353b is in use. That is, with the generation of the compensation current $i_{cd}$, the output signal Vout is increased, and the undershoot is suppressed.

FIG. 8 is a flow diagram illustrating operations of the compensation circuit in FIG. 7A. Firstly, the current providing path 3535b provides the compensation current $i_{cd}$ (step S51), and the mediate signal Vmd decreases accordingly (step S52). Meanwhile, the gain stage signal Vgd increases in response to the dropping of the input signal Vin. Then, the suppression activation circuit 3536b compares the gain stage signal Vgd with an undershoot threshold Vgd_th and determines if the undershoot compensation condition, for example, the inequality Vgd>Vgd_th, is satisfied (step S53). If the determination result of step S53 is negative, the flow ends, and the undershoot compensation circuit 3536b does not affect the gain stage signal Vgu nor the output signal Vout.

If the determination result of step S53 is positive, the undershoot compensation circuit 3536b operates and passes the compensation current $i_{cd}$ to the gain stage terminal Ngd (step S54). Accordingly, the gain stage signal Vgd decreases as the compensation current $i_{cd}$ transmits the ground voltage Gnd to the gain stage terminal Ngd (step S55). With the decrement of the gain stage signal Vgd, the transistor MNi conducts less output current $i_{od}$ from the output terminal Nout to the ground terminal Gnd (step S56). Later, the output signal Vout increases, and the undershoot is suppressed accordingly (step S57).

Figure 9:
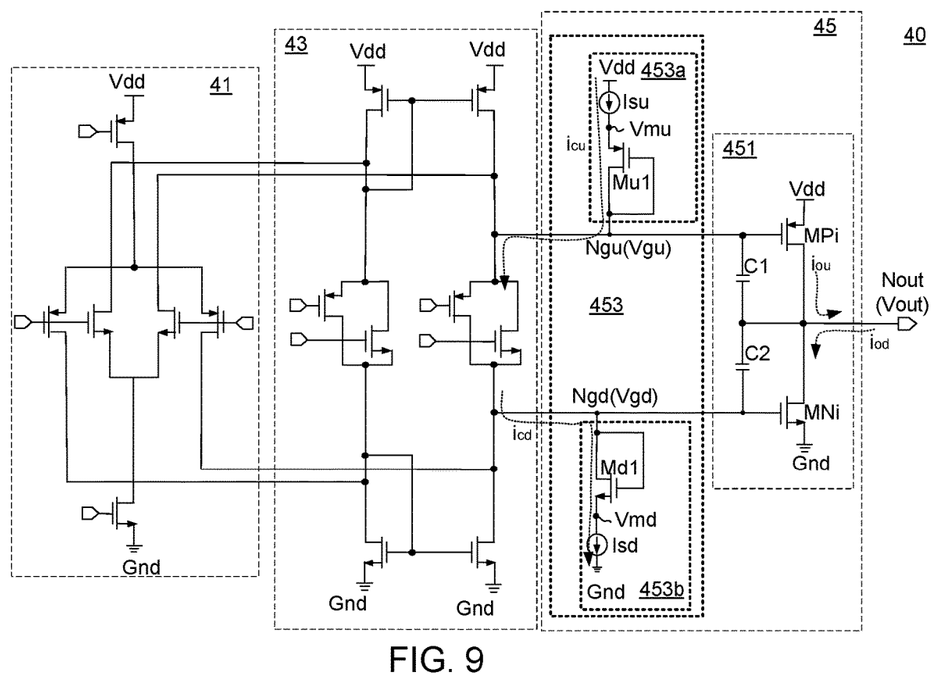
FIG. 9 is a schematic diagram illustrating an exemplary implementation of the compensation module.
Figure 10:
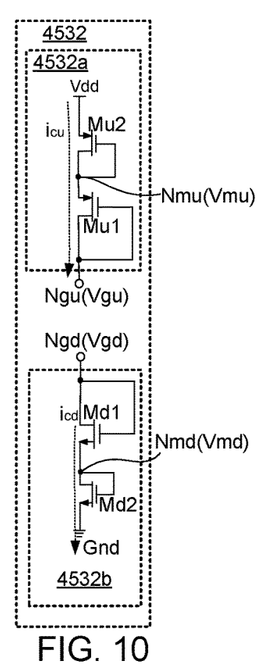
FIG. 10 is a schematic diagram illustrating another exemplary implementation of the compensation module.
Figure 11:
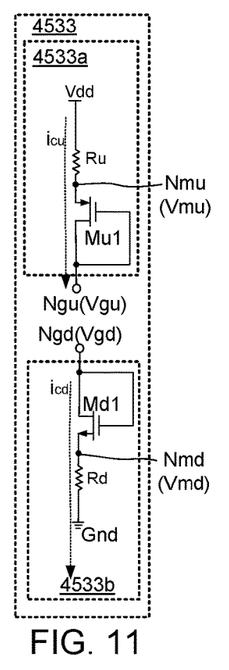
FIG. 11 is a schematic diagram illustrating an alternative exemplary implementation of the compensation module.

Different exemplary implementations of the compensation module are shown in FIGS. 9, 10, and 11. For the sake of illustration, only FIG. 9 shows the schematic of the operational amplifier. The differential input stage circuit, the gain stage circuit, and the inverting circuit are omitted in FIGS. 10 and 11.

FIG. 9 is a schematic diagram illustrating an exemplary implementation of the compensation module. The operational amplifier 40 includes a differential input stage circuit 41, a gain stage circuit 43, and an output stage circuit 45. The output stage circuit 45 includes a compensation module 453 and an inverting circuit 451. The compensation module 453 further includes an overshoot compensation circuit 453a and an undershoot compensation circuit 453b.

In the overshoot compensation circuit 453a, the current providing path is assumed to be a current source Isu, and the suppression activation circuit is assumed to be a PMOS transistor Mu1. The source terminal of the PMOS transistor Mu1 is electrically connected to the mediate terminal Nmu, and the gate terminal and the drain terminal of the PMOS transistor Mu1 are electrically connected to the gain stage terminal Ngu.

The PMOS transistor Mu1 is turned on if the voltage difference between the mediate signal Vmu (equivalent to the voltage of the source terminal of the PMOS transistor Mu1) and the gain stage signal Vgu (equivalent to the voltage of the gate terminal and the drain terminal of the PMOS transistor Mu1) is greater than the transistor threshold voltage of the PMOS transistor Mu1 ($Vth_{Mu1}$), that is, (Vmu−Vgu)>$Vth_{Mu1}$. Alternatively speaking, when the inequality Vgu<(Vmu−$Vth_{Mu1}$) is satisfied, the PMOS transistor Mu1 is turned on, and the compensation current $i_{cu}$ flows from the supply voltage Vdd to the gain stage terminal Ngu. Therefore, the voltage difference (Vmu−$Vth_{Mu1}$) can be considered as the overshoot threshold Vgu_th of the overshoot compensation circuit 453a. That is, Vgu_th=(Vmu−$Vth_{Mu1}$).

In the undershoot compensation circuit 453b, the current providing path is assumed to be another current source Isd, and the suppression activation circuit is assumed to be an NMOS transistor Md1. The source terminal of the NMOS transistor Md1 is electrically connected to the mediate terminal Nmd, and the gate terminal and the drain terminal of the NMOS transistor Md1 are electrically connected to the gain stage terminal Ngd.

The NMOS transistor Md1 is turned on if the voltage difference between the gain stage signal Vgd (equivalent to the voltage of the gate terminal and the drain terminal of the NMOS transistor Md1) and the mediate signal Vmd (equivalent to the voltage of the source terminal of the NMOS transistor Md1) is greater than the transistor threshold voltage of the NMOS transistor Md1 ($Vth_{Md1}$), that is, (Vgd−Vmd)>$Vth_{Md1}$. Alternatively speaking, when the inequality Vgd>(Vmd+$Vth_{Md1}$) is satisfied, the NMOS transistor Md1 is turned on, and the compensation current $i_{cd}$ flows from the gain stage terminal Ngd to the ground terminal Gnd. Therefore, the voltage difference (Vmd+$Vth_{Md1}$) can be considered as the overshoot threshold Vgd_th of the undershoot compensation circuit 453b. That is, Vgd_th=(Vmd+$Vth_{Md1}$).

FIG. 10 is a schematic diagram illustrating another exemplary implementation of the compensation module. In FIG. 10, the compensation module 4532 includes an overshoot compensation circuit 4532a, and an undershoot compensation circuit 4532b.

In the overshoot compensation circuit 4532a, the current providing path is assumed to be a PMOS transistor Mu2, and the suppression activation circuit is assumed to be another PMOS transistor Mu1. The source terminal of the PMOS transistor Mu2 is electrically connected to the voltage source Vdd, and the gate terminal and the drain terminal of the PMOS transistor Mu2 are electrically connected to the mediate terminal Nmu. As the relative connections of the PMOS transistor Mu1 are similar to the ones in FIG. 9, details are omitted here.

The PMOS transistor Mu1 is turned on if the inequality (Vmu−Vgu)>$Vth_{Mu1}$ is satisfied. Moreover, when the PMOS transistor Mu2 is turned on, the mediate signal Vmu can be represented as the voltage difference between the supply voltage Vdd and the transistor threshold voltage of the PMOS transistor Mu2 ($Vth_{Mu2}$), that is, Vmu=(Vdd−$Vth_{Mu2}$). Based on the equations (Vmu−Vgu)>$Vth_{Mu1}$ and Vu=(Vdd−$Vth_{Mu2}$), the PMOS transistor Mu1 is turned on if the inequality Vgu<(Vdd−$Vth_{Mu2}$−$Vth_{Mu1}$) is satisfied. Therefore, (Vdd−$Vth_{Mu2}$−$Vth_{Mu1}$) can be considered as the overshoot threshold Vgu_th of the overshoot compensation circuit 4532a. That is, Vgu_th=(Vdd−$Vth_{Mu2}$−$Vth_{Mu1}$).

In the undershoot compensation circuit 4532b, the current providing path is assumed to be an NMOS transistor Md2, and the suppression activation circuit is assumed to be another NMOS transistor Md1. The source terminal of the NMOS transistor Md2 is electrically connected to the ground terminal Gnd, and the gate terminal and the drain terminal of the NMOS transistor Md2 are electrically connected to the mediate terminal Nmd. As the connections of the NMOS transistor Md1 are similar to the ones in FIG. 9, details are omitted here.

The NMOS transistor Md1 is turned on if the inequality (Vgd−Vd)>$Vth_{Md1}$ is satisfied. Moreover, when the NMOS transistor Md2 is turned on, the mediate signal Vmd can be represented as summation of the ground voltage Gnd and the transistor threshold voltage of the PMOS transistor Md2 ($Vth_{Md2}$), that is, Vd=(0V+$Vth_{Md2}$). Based on the equations (Vgd−Vd)>$Vth_{Md1}$ and Vd=(0V+$V_{Md2}$), the NMOS transistor Md1 is turned on if the inequality Vgd>($Vth_{Md1}$+$Vth_{Md2}$) is satisfied. Therefore, ($Vth_{Md1}$+$Vth_{Md2}$) can be considered as the undershoot threshold Vgd_th of the undershoot compensation circuit 4532b. That is, Vgd_th=($Vth_{Md1}$+$Vth_{Md2}$).

FIG. 11 is a schematic diagram illustrating an alternative exemplary implementation of the compensation module. In FIG. 11, the compensation module 4533 includes an overshoot compensation circuit 4533a, and an undershoot compensation circuit 4533b.

In the overshoot compensation circuit 4533a, the current providing path is assumed to be a resistor Ru, and the suppression activation circuit is assumed to be a PMOS transistor Mu1. The resistor Ru is electrically connected to the supply voltage Vdd and the mediate terminal Nmu, and the voltage difference between the two terminals of the resistor Ru is represented as $V_{Ru}$. As the connections of the PMOS transistor Mu1 are similar to the ones in FIG. 9, details are omitted here.

The PMOS transistor Mu1 is turned on if the inequality (Vmd−Vgu)>$Vth_{Mu1}$ is satisfied. Moreover, the mediate signal Vmu can be represented by the voltage difference between the supply voltage Vdd and the voltage difference $V_{Rd}$, that is, Vmu=Vdd−$V_{Ru}$. Based on the equations (Vmd−Vgu)>$Vth_{Mu1}$ and Vmu=Vdd−$V_{Ru}$, the PMOS transistor Mu1 is turned on if the inequality Vgu<(Vdd−$V_{Ru}$−$Vth_{Mu1}$) is satisfied. Therefore (Vdd−$V_{Ru}$−$Vth_{Mu1}$) can be considered as the overshoot threshold Vgu_th of the undershoot compensation circuit 4533a. That is, Vgu_th=(Vdd−$V_{Ru}$−$Vth_{Mu1}$).

In the undershoot compensation circuit 4533b, the current providing path is assumed to be another resistor Rd, and the suppression activation circuit is assumed to be an NMOS transistor Md1. The resistor Rd is electrically connected to the mediate terminal Nmd and the ground voltage Gnd, and the voltage difference between the two terminals of the resistor Rd is represented as $V_{Rd}$. As the connections of the NMOS transistor Md1 are similar to the ones in FIG. 9, details are omitted here.

The NMOS transistor Md1 is turned on if the inequality (Vgd−Vmd)>$Vth_{Md1}$ is satisfied. Moreover, the mediate signal Vmd can be represented as the voltage difference between the ground voltage Gnd and the voltage difference $V_{Rd}$, that is, Vmd=$V_{Rd}$. Based on the equations (Vgd−Vmd) >Vth$_{Md1}$ and Vmd=$V_{Rd}$, the NMOS transistor Md1 is turned on if the inequality Vgd>(Vth$_{Md1}$+$V_{Rd}$) is satisfied. Therefore, (Vth$_{Md1}$+$V_{Rd}$) can be considered as the undershoot threshold Vgd_th of the undershoot compensation circuit 4533b. That is, Vgd_th=(Vth$_{Md1}$+$V_{Rd}$).

FIGS. 9, 10, and 11 are examples showing that the current providing paths can be a current source, a transistor, or a resistor. These examples do not limit the practical design of the current providing path. In some applications, the compensation module may further include a trigger circuit and two switches.

Figure 12:
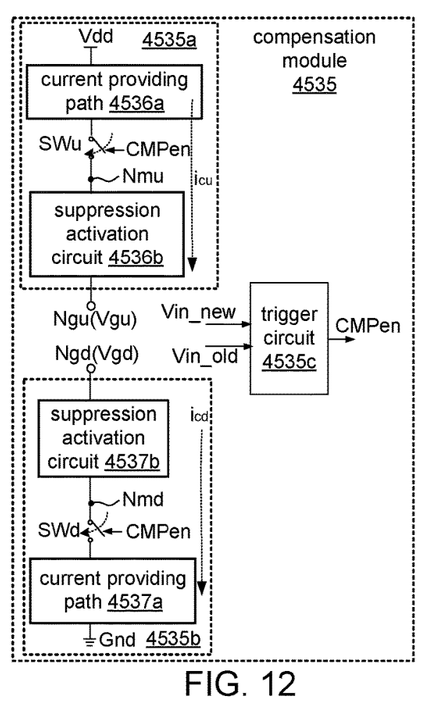
FIG. 12 is a schematic diagram illustrating the compensation module having a trigger circuit.

FIG. 12 is a schematic diagram illustrating the compensation module having a trigger circuit. The compensation module 4535 includes a trigger circuit 4535c, an overshoot compensation circuit 4535a, and an undershoot compensation circuit 4535b.

The trigger circuit 4535c is electrically connected to the differential input stage circuit, from which the trigger circuit 4535c receives the input signal Vin. The input signal Vin being received by the trigger circuit 4535c are generated at two separate time points, one current input signal Vin_new generated at a current time point and one previous input signal Vin_old generated at a previous time point. The previous input signal Vin_old is recorded in a format of digital code so that the trigger circuit 4535c can compare the scale of the previous input signal Vin_old and the scale of the current input signal Vin_new. Moreover, as the output signal Vout of the unity gain buffer is conducted to the inverting input terminal Nin1, the previous input signal Vin_old is equivalent to the output signal Vout at the current time point.

In FIG. 12, the overshoot compensation circuit 4535a further includes a switch Swu, and the undershoot compensation circuit further includes a switch SWd. The switch SWu is electrically connected to the trigger circuit 4535c, the current providing path 4536a and the suppression activation circuit 4536b, and the switch SWd is electrically connected to the trigger circuit 4535c, the current providing path 4537a and the suppression activation circuit 4537b. The switches SWu, SWd are controlled by a trigger signal CMPen.

When a voltage difference between the current input signal Vin_new and the previous input signal Vin_old is less than or equivalent to a predefined difference threshold, that is, |Vin_new−Vin_old|≤Vin_th, the trigger signal CMPen remains at a low logic level. Consequentially, the switches SWu, SWd are switched off, the suppression activation circuit 4536b is disconnected to the current providing path 4536a, and the suppression activation circuit 4537b is disconnected to the current providing path 4537a. Thus, none of the compensation currents $i_{cu}$, $i_{cd}$ can be conducted to the gain stage terminals Ngu, Ngd.

When the voltage difference between the current input signal Vin_new and the previous input signal Vin_old is greater than the predefined difference threshold, that is, |Vin_new−Vin_old|>Vin_th, the trigger signal CMPen remains at a high logic level. Consequentially, the switches SWu, SWd are switched on. The suppression activation circuit 4536b is connected to the current providing path 4536a through the switch SWu, and the compensation current $i_{cu}$ can be conducted to the gain stage terminal Ngu. The suppression activation circuit 4537b is connected to the current providing path 4537a through the switch SWd, and the compensation current $i_{cd}$ can be conducted to the gain stage terminal Ngd.

In other words, when the voltage difference between the current input signal Vin_new and the previous input signal Vin_old is less than or equivalent to the predefined difference threshold Vin_th, none of the overshoot compensation circuit 4535a and the undershoot compensation circuit 4535b operates and the output signal Vout generated by the operational amplifier is capable of reacting changes of the input signal Vin. Furthermore, the slew rate of the output signal Vout can be improved. The increased slew rate improves the transient response of the output signal Vout.

In some applications, the gain stage circuit 13 includes a cascode circuit. Use of the cascode circuit can improve input-output isolation as there is less direct coupling from the output signal Vout to the input signal Vin.

Figure 13:
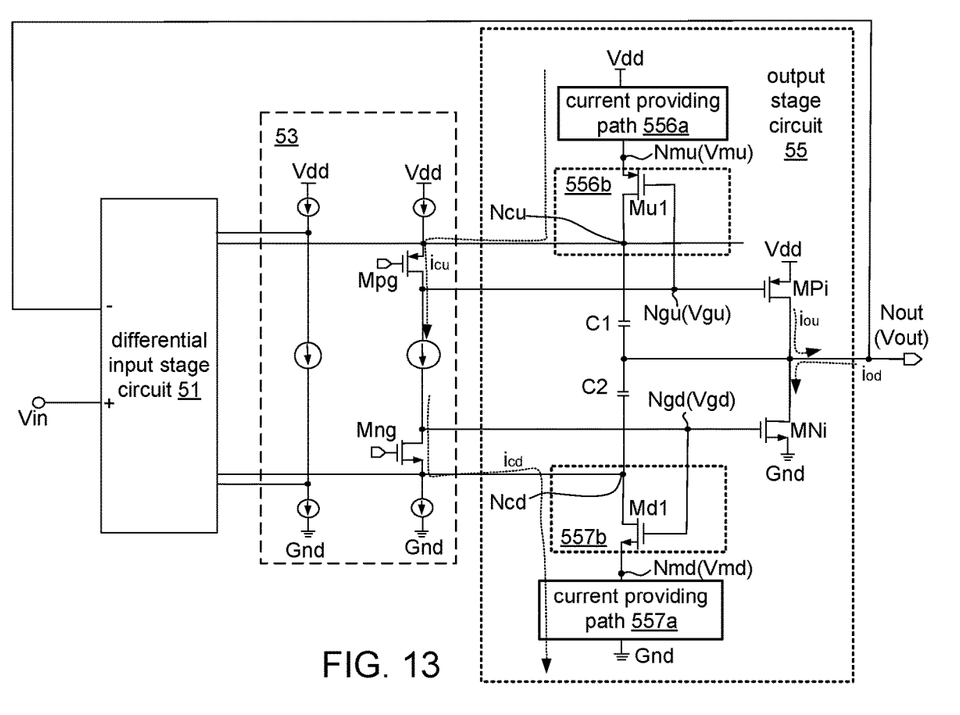
FIG. 13 is a schematic diagram illustrating a scenario that the compensation module is applied to the gain stage circuit having a cascode circuit.

FIG. 13 is a schematic diagram illustrating a scenario that the compensation module is applied to the gain stage circuit having a cascode circuit. The gain stage circuit 53 includes a cascode circuit, and the cascode circuit includes cascode components, that is, transistors Mpg, Mng.

The source terminal of transistor Mpg is electrically connected to the differential input stage circuit 51 and the suppression activation circuit 556b through a cascode terminal Ncu. The drain terminal of the transistor Mpg is electrically connected to the gain stage terminal Ngu. The compensation current $i_{cu}$ provided by the current providing path 556a flows through the suppression activation circuit 556b (transistor Mu1) and the transistor Mpg.

When the cascade circuit is used, a bias voltage is provided to the gate terminal of the PMOS transistor Mpg. If the transistor Mu1 is turned on, the overshoot compensation current $i_{cu}$ flows through the transistor Mu1 so that the voltage at the cascode terminal Ncu increases and the PMOS transistor Mpg is turned on. Consequentially, the overshoot compensation current $i_{cu}$ flows through the PMOS transistors Mu1, Mpg, and the gain stage signal Vgu increases.

The PMOS transistor Mu1 is turned off if the inequality (Vmu−Vgu)>Vth$_{Mu1}$ is not satisfied. On the other hand, when the inequality (Vmu−Vgu)>Vth$_{Mu1}$ is satisfied, the PMOS transistor Mu1 is turned on, and the compensation current $i_{cu}$ flows through the suppression activation circuit 556b (transistor Mu1) and the cascode component (PMOS transistor Mpg) to the gain stage terminal Ngu. Depending on the design of the current providing path 556a, the actual voltage of the mediate signal Vmu may vary.

The source terminal of the NMOS transistor Mng is electrically connected to the differential input stage circuit 51 and the suppression activation circuit 557b through a cascode terminal Ncd. The drain terminal of the NMOS transistor Mng is electrically connected to the gain stage terminal Ngd. The compensation current $i_{cd}$ provided by the current providing path 557a flows through the NMOS transistor Mng and the suppression activation circuit 557b (transistor Md1).

When the cascade circuit is used, a bias voltage is provided to the gate terminal of the NMOS transistor Mng. If the NMOS transistor Md1 is turned on, the undershoot suppression current $i_{cd}$ flows through the NMOS transistor Md1 so that the voltage at the cascode terminal Ncd decreases and the NMOS transistor Mng is turned on. Consequentially, the undershoot suppression current $i_{cd}$ flows through the NMOS transistors Mng, Md1, and the gain stage signal Vgd decreases.

The NMOS transistor Md1 is turned off if the inequality (Vgd−Vmd)>Vth$_{Md1}$ is not satisfied. On the other hand, when the inequality (Vgd−Vmd)>Vth$_{Md1}$ is satisfied, the NMOS transistor Md1 is turned on, and the compensation current $i_{cd}$ flows from the gain stage terminal Ngd, through the suppression activation circuit 557b (transistor Md1) and the cascode component (NMOS transistor Mng), to the ground terminal Gnd. Depending on the design of the current providing path 557a, the mediate signal Vmd may vary.

A signal amplifying method applied to the operational amplifier is provided. The differential input stage circuit amplifies the voltage difference between the input signal Vin and the output signal Vout to generate an input stage signal. Then, the gain stage circuit provides a voltage gain to the input stage signal. Moreover, the gain stage circuit generates gain stage signals Vgu/Vgd accordingly. Later, the inverting circuit generates the output signal Vout. In addition, in response to the generation of the overshoot/undershoot, the compensation module of the output stage circuit selectively conducts a compensation current $i_{cu}$, $i_{cd}$ to dynamically adjusts the output signal Vout.

To suppress the overshoot, a compensation current $i_{cu}$ is conducted to adjust the gain stage signal Vgu if the overshoot compensation condition (for example, the inequality Vgu<Vgu_th) is satisfied. The compensation current $i_{cu}$ brings an increment of the gain stage signal Vgu and a decrement of the output signal Vout. The overshoot is suppressed as the output signal Vout decreased.

To suppress the undershoot, a compensation current $i_{cd}$ is conducted to adjust the gain stage signal Vgd if the undershoot compensation condition, for example, the inequality Vgd>Vgd_th, is satisfied. The compensation current $i_{cd}$ brings a decrement in the gain stage signal Vgd and increment of the output signal Vout. The undershoot is suppressed as the output signal Vout is increased.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An output stage circuit of an operational amplifier, comprising:
    an inverting circuit, electrically connected to a gain stage circuit of the operational amplifier, configured to generate an output signal of the operational amplifier; and
    a compensation module, electrically connected to the inverting circuit and the gain stage circuit, comprising:
    a first compensation circuit, comprising:
    a first current providing path, configured to provide a first compensation current; and
    a first suppression activation circuit, electrically connected to the first current providing path and the inverting circuit, configured to conduct the first compensation current to the inverting circuit if a first compensation condition related to a first gain stage signal generated by the gain stage circuit is satisfied, wherein a variation of the output signal is suppressed because of the first compensation current.

2. The output stage circuit according to claim 1, wherein the first gain stage signal is varied with the first compensation current, wherein
    the output signal decreases when the first gain stage signal increases, and
    the output signal increases when the first gain stage signal decreases.

3. The output stage circuit according to claim 1, wherein the compensation module further comprises:
    a second compensation circuit, comprising:
    a second current providing path, configured to provide a second compensation current; and
    a second suppression activation circuit, electrically connected to the second current providing path and the inverting circuit, configured to conduct the second compensation current to the inverting circuit if a second compensation condition related to a second gain stage signal generated by the gain stage circuit is satisfied, wherein the variation of the output signal is suppressed because of the second compensation current.

4. The output stage circuit according to claim 3, wherein one of the first current providing path and the second current providing path receives a supply voltage, and the other one of the first current providing path and the second current providing path receives a ground voltage.

5. The output stage circuit according to claim 3, wherein the gain stage circuit comprises:
    a cascode circuit, comprising:
    a first cascode component, electrically connected to a differential input stage circuit, the inverting circuit, and the first suppression activation circuit, configured to output the first gain stage signal, wherein the first compensation current flows through the first cascode component; and
    a second cascode component, electrically connected to the differential input stage circuit, the inverting circuit, and the second suppression activation circuit, configured to output the second gain stage signal, wherein the second compensation current flows through the second cascode component.

6. The output stage circuit according to claim 1, wherein the first current providing path is a current source, a transistor or a resistor.

7. An operational amplifier, comprising:
    a differential input stage circuit, configured to amplify a voltage difference between an input signal and an output signal of the operational amplifier to generate an input stage signal;
    a gain stage circuit, electrically connected to the differential input stage circuit, configured to provide a voltage gain to the input stage signal and accordingly generate a first gain stage signal; and
    an output stage circuit, comprising:
    an inverting circuit, electrically connected to the gain stage circuit, configured to generate the output signal; and
    a compensation module, electrically connected to the inverting circuit, comprising:
    a first compensation circuit, comprising:
    a first current providing path, configured to provide a first compensation current; and
    a first suppression activation circuit, electrically connected to the first current providing path and the inverting circuit, configured to conduct the first compensation current to the inverting circuit if a first compensation condition related to the first gain stage signal is satisfied, wherein a variation of the output signal is suppressed because of the first compensation current.

8. The operational amplifier according to claim 7, wherein the first gain stage signal is varied with the first compensation current, wherein
    the output signal decreases when the first gain stage signal increases, and
    the output signal increases when the first gain stage signal decreases.

9. The operational amplifier according to claim 7, wherein the gain stage circuit further generates a second gain stage signal, and the compensation module further comprises:
a second compensation circuit, comprising:
a second current providing path, configured to provide a second compensation current; and
a second suppression activation circuit, electrically connected to the second current providing path and the inverting circuit, configured to conduct the second compensation current to the inverting circuit if a second compensation condition related to the second gain stage signal is satisfied, wherein the variation of the output signal is suppressed because of the second compensation current.

10. The operational amplifier according to claim 9, wherein one of the first current providing path and the second current providing path receives a supply voltage, and the other one of the first current providing path and the second current providing path receives a ground voltage.

11. The operational amplifier according to claim 9, wherein the gain stage circuit comprises:
a cascode circuit, comprising:
a first cascode component, electrically connected to the differential input stage circuit, the inverting circuit, and the first suppression activation circuit, configured to output the first gain stage signal, wherein the first compensation current flows through the first cascode component; and
a second cascode component, electrically connected to the differential input stage circuit, the inverting circuit, and the second suppression activation circuit, configured to output the second gain stage signal, wherein the second compensation current flows through the second cascode component.

12. The operational amplifier according to claim 7, wherein the first compensation circuit further comprises:
a first switch, electrically connected to the first current providing path and the first suppression activation circuit, wherein the first compensation current flows through the first switch when the first switch is turned on by a trigger signal.

13. The operational amplifier according to claim 12, wherein the compensation module further comprises:
a trigger circuit, electrically connected to the differential input stage circuit and the first switch, configured to generate the trigger signal based on comparison between the input signal and the output signal.

14. The operational amplifier according to claim 13, wherein
the trigger circuit sets the trigger signal to a first logic level if the voltage difference is greater than a predefined difference threshold; and
the trigger circuit sets the trigger signal to a second logic level if the voltage difference is less than or equivalent to the predefined difference threshold.

15. The operational amplifier according to claim 7, wherein the first current providing path is a current source, a transistor or a resistor.

16. The operational amplifier according to claim 15, wherein if the first current providing path is the transistor, a gate terminal and a drain terminal of the transistor are electrically connected to each other.

17. The operational amplifier according to claim 7, wherein the first suppression activation circuit is a transistor.

18. The operational amplifier according to claim 17, wherein a gate terminal of the transistor is electrically connected to the gain stage circuit and the inverting circuit.

19. A signal amplifying method applied to an operational amplifier, comprising steps of:
amplifying a voltage difference between an input signal and an output signal of the operational amplifier to generate an input stage signal;
providing a voltage gain to the input stage signal and accordingly generating a first gain stage signal;
generating the output signal; and
conducting a first compensation current to adjust the first gain stage signal if a first compensation condition related to the first gain stage signal is satisfied, wherein a variation of the output signal is suppressed because of the first compensation current.

20. The signal amplifying method according to claim 19, wherein
the first gain stage signal is varied with the first compensation current, wherein
the output signal decreases when the first gain stage signal increases, and
the output signal increases when the first gain stage signal decreases.

* * * * *